(12) United States Patent
Nishimura et al.

(10) Patent No.: US 8,242,355 B2
(45) Date of Patent: *Aug. 14, 2012

(54) PHOTOELECTRIC CONVERSION ELEMENT AND SOLAR CELL

(75) Inventors: Kazukuni Nishimura, Tokyo (JP); Akihiko Itami, Tokyo (JP); Fumitaka Mochizuki, Tokyo (JP); Hideya Miwa, Tokyo (JP); Hidekazu Kawasaki, Tokyo (JP)

(73) Assignee: Konica Minolta Business Technologies, Inc., Tokyo (JP)

( * ) Notice: Subject to any disclaimer, the term of this patent is extended or adjusted under 35 U.S.C. 154(b) by 627 days.

This patent is subject to a terminal disclaimer.

(21) Appl. No.: 12/056,712

(22) Filed: Mar. 27, 2008

(65) Prior Publication Data

US 2008/0296564 A1  Dec. 4, 2008

(30) Foreign Application Priority Data

May 31, 2007  (JP) ................. 2007-144881

(51) Int. Cl.
*H01L 31/00* (2006.01)
*H01L 51/00* (2006.01)
*H01L 21/00* (2006.01)
*C07C 211/00* (2006.01)
*H01M 6/30* (2006.01)

(52) U.S. Cl. .............. 136/263; 136/252; 257/40; 257/3; 257/431; 438/85; 438/82; 564/434; 564/305; 429/111

(58) Field of Classification Search .................. 136/263, 136/252; 257/3, 40, 431; 438/82, 85; 564/434, 564/305; 429/111

See application file for complete search history.

(56) References Cited

U.S. PATENT DOCUMENTS

2008/0067476 A1* 3/2008 Shigaki et al. ............. 252/501.1

FOREIGN PATENT DOCUMENTS

| JP | 2005019253 | 1/2005 |
| JP | 2005123033 | 5/2005 |
| JP | 2006079898 | 3/2006 |
| JP | 2006134649 | 5/2006 |
| JP | 2006156212 | 6/2006 |
| JP | 2006-286609 | * 11/2006 |
| WO | WO2006/028087 A1 * | 3/2006 |

OTHER PUBLICATIONS

JP2006-286609, Ishii, Nov. 2006.*

Xu, "New triphenylamine Based Dyes for Dye Sensitized Solar Cells", J. Physical Chemistry C, 112, 874-880, Jan. 1, 2008.*

* cited by examiner

*Primary Examiner* — Basia Ridley
*Assistant Examiner* — Devina Pillay
(74) *Attorney, Agent, or Firm* — Lucas & Mercanti, LLP

(57) ABSTRACT

A photoelectric conversion element having a pair of electrodes, and a semiconductor layer comprising a semiconductor carrying a dye and an electrolyte layer is disclosed. The dye is represented by Formulas 1 or 2;

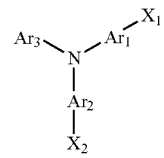

Formula 1 in Formula 1, $Ar_1$ and $Ar_2$ are each an arylene or heterocyclic group, or a composite group of an arylene group and a heterocyclic group, each of which may have a substituent, $Ar_3$ is an aryl or heterocyclic group or a composite group of an arylene group and a heterocyclic group, each of which may have a substituent, $Ar_1$, $Ar_2$ and $Ar_3$ may form a ring by bonding with each other, $X_1$ and $X_2$ are each a straight chain residue having an acidic group which may have a monovalent substituent, and one to eight saturated or unsaturated aliphatic hydrocarbon group having 5 to 30 carbon atoms are bonded to $Ar_1$, $Ar_2$ and $Ar_3$;

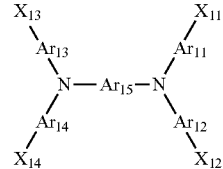

Formula 2 in the formula, $Ar_{11}$, $Ar_{12}$, $Ar_{13}$, $Ar_{14}$ and $Ar_{15}$ are each an arylene or heterocyclic group, or a composite group of an arylene group and a heterocyclic group, each of which may have a substituent, $Ar_{11}$, $Ar_{12}$, $Ar_{13}$, $Ar_{14}$ and $Ar_{15}$ may form a ring by bonding with together, at least two of $X_{11}$, $X_{12}$, $X_{13}$ and $X_{14}$ are each an alkyl or alkenyl group having an acidic group which may have a mono-valent substituent and the remainders are each a hydrogen atom, and one to eight saturated or unsaturated aliphatic hydrocarbon group having 5 to 30 carbon atoms are bonded to $Ar_{11}$, $Ar_{12}$, $Ar_{13}$, $Ar_{14}$ and $Ar_{15}$.

18 Claims, No Drawings

PHOTOELECTRIC CONVERSION ELEMENT AND SOLAR CELL

This application is based on Japanese Patent Application No. 2007-144881 filed on May 31, 2007, the entire content of which is hereby incorporated by reference.

TECHNICAL FIELD

The present invention relates to a dye-sensitized type photoelectric conversion element and a solar cell constituted by using the photoelectric conversion element.

TECHNICAL BACKGROUND

Recently, application of solar light is energetically investigated, which is infinity and generate no noxious substance. As the means practically used at the present time for utilizing the clean energy source of solar light, inorganic solar cells such as single crystal silicone for domestic use, polycrystal silicone, amorphous silicone, cadmium telluride and indium copper selenide are cited.

However, the solar cells, for example, the silicone type have drawbacks such as that extremely high purity is required so that complicated process including many steps is necessary and the production cost is raised.

On the other hand, many solar cells using an organic material are proposed. The organic solar cell includes a Schottky type photoelectric conversion element and a heterojunction type photoelectric conversion element in which a p-type organic semiconductor and an n-type organic semiconductor or a p-type organic semiconductor and an electron acceptable organic compound are joined. The organic semiconductor includes synthesized dyes or pigments such as chlorophyll and perylene, electroconductive polymers such as polyacetylene and composite materials of them. Such the materials are each made into a thin layer by a vacuum deposition method, a casting method or a dipping method for constituting the material of the cells. The organic materials have an advantage such that the cost is low and a large area material can be easily produced, but has a problem of low durability and the majority of them are low in the conversion efficiency as not more than 1%.

In such the situation, a solar cell showing suitable properties has been proposed by Dr. Gratzel in Switzerland, cf. Non-patent document 1 for example. The proposed cell is a dye sensitized type solar cell which is a wet type solar cell having a functional electrode composed of a porous titanium oxide thin layer spectrally sensitized by a ruthenium complex. Advantages of such the system are that the cell is cheep in the cost since a cheep oxide such as titanium oxide which is not necessary to highly purify and the range of applicable light widely covers visible range so as to effectively transducer solar light containing much visible light to electricity.

However, there is doubt as to supply of ruthenium when such the solar cells are practically used since ruthenium is limited resource. Moreover, ruthenium is high in the coast and has a problem of aging stability. Such the problems can be solved by exchanging ruthenium by a low-price and stable organic dye.

It has been known that a dye molecule having both of a π-electron conjugated system having electron donating ability and an acidic adsorption group gives a cell having high photoelectric conversion efficiency. Triarylamine derivatives are widely used as the electron donating π-electron conjugated system; cf. Patent Documents 1 to 4. However, the absorption peak of the solution of such the dye is not more than 500 nm and a problem that the absorption at the long wavelengths side is weak is left. A photoelectric conversion element capable of more effectively applying solar light can be obtained by expanding the absorption region of the dye to longer wavelength side. As a means for expanding the light absorption region to longer wavelength side, a means by formation of J-aggregate can be cited; cf. Patent Document 5, for example.

Patent Document 1: JP-A2005-123033
Patent Document 2: JP-A2006-079898
Patent Document 3: JP-A2006-134649
Patent Document 4: JP-A2006-156212
Patent Document 5: JP-A2005-019253
Non-patent Document 1: Nature, 353, 737 (1991), B. O. Regan, M. Gratzel

SUMMARY OF THE INVENTION

An object of the invention is to provide a dye sensitized type transducer having high photoelectric conversion efficiency and high durability, and a solar cell using the photoelectric conversion element.

An aspect of the invention is a photoelectric conversion element comprising a pair of electrodes, and a semiconductor layer carrying a dye and an electrolyte layer between the electrodes, wherein the semiconductor layer contains a compound represented by Formulas 1 or 2;

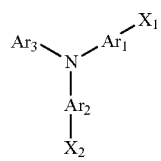

Formula 1 in Formula 1, $Ar_1$ and $Ar_2$ are each an arylene or heterocyclic group, or a composite group of an arylene group and a heterocyclic group, $Ar_3$ is an aryl or heterocyclic group or a composite group of an arylene group and a heterocyclic group, each of which may have a substituent, $Ar_1$, $Ar_2$ and $Ar_3$ may form a ring by bonding with each other, $X_1$ and $X_2$ are each a straight chain residue having an acidic group which may have a mono-valent substituent, and one to eight saturated or unsaturated aliphatic hydrocarbon group having 5 to 30 carbon atoms are bonded to $Ar_1$, $Ar_2$ and $Ar_3$;

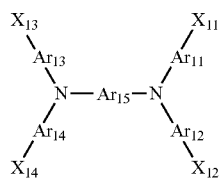

Formula 2 in Formula 2, $Ar_{11}$, $Ar_{12}$, $Ar_{13}$, $Ar_{14}$ and $Ar_{15}$ are each arylene or heterocyclic group, or a composite group of an arylene group and a heterocyclic group, each of which may have a substituent, $Ar_{11}$, $Ar_{12}$, $Ar_{13}$, $Ar_{14}$ and $Ar_{15}$ may form a ring by bonding with together, at least two of $X_{11}$, $X_{12}$, $X_{13}$ and $X_{14}$ are each an alkyl or alkenyl group having an acidic group which may have a mono-valent substituent and the remainders are each a hydrogen atom, and one to eight saturated or unsaturated aliphatic hydrocarbon group having 5 to 30 carbon atoms are bonded to $Ar_{11}$, $Ar_{12}$, $Ar_{13}$, $Ar_{14}$ and $Ar_{15}$.

The semiconductor layer is preferably titanium oxide.

The aliphatic hydrocarbon group in Formulas 1 or 2 is preferably a straight-chain alkyl group.

In the Formula 2, two of $X_{11}$, $X_{12}$, $X_{13}$ and $X_{14}$ are preferably each a straight-chain residue having an acidic group which may have a mono-valent substituent.

The acidic group of the compound represented by Formulas 1 or 2 is preferably a carboxyl group.

The group represented by $X_1$ or $X_2$ preferably has a cyano group.

The groups each having acidic group among the groups represented by $X_{11}$, $X_{12}$, $X_{13}$ and $X_{14}$ of the compound represented by Formula 2 each have preferably a cyano group.

The acidic group in one of $X_1$, $X_2$, $X_{11}$, $X_{12}$, $X_{13}$ and $X_{14}$ and one of $Ar_1$, $Ar_2$, $Ar_{11}$, $Ar_{12}$, $Ar_{13}$ and $Ar_{14}$ are each bonded by a π-conjugation system in each of the compound represented by Formulas 1 and 2.

The groups of $Ar_1$, $Ar_2$ and $Ar_3$ of the compound represented by Formula 1 are preferably each a benzene ring, a thiophene ring or a composite thereof.

The groups of $Ar_{11}$, $Ar_{12}$, $Ar_{13}$, $Ar_{14}$ and $Ar_{15}$ of the compound represented by Formula 2 are preferably each a benzene ring, a thiophene ring or a condensed ring thereof.

The groups of $Ar_1$ and $Ar_2$ in the compound represented by Formula 1 are group of each a benzene ring and the corresponding $X_1$ and $X_2$ are each bonded to 4-position each of the benzene ring.

The groups of $Ar_{11}$, $Ar_{12}$, $Ar_{13}$ and $Ar_{14}$ in the compound represented by Formula 2 are preferably each a benzene ring and the corresponding $X_{11}$, $X_{12}$, $X_{13}$ and $X_{14}$ are each bonded to 4-position of each of the benzene ring.

The groups of $Ar_1$ and $Ar_2$ preferably have the structure represented by Formula 3 and the corresponding $X_1$ and $X_2$ are each bonded to the 5-position of the thiophene ring.

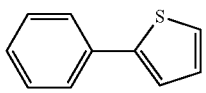

Formula 3

The groups of $Ar_{11}$, $Ar_{12}$, $Ar_{13}$ and $Ar_{14}$ preferably have the structure represented by Formula 3 and the corresponding $X_{11}$, $X_{12}$, $X_{13}$ and $X_{14}$ are each bonded to the 5-position of the thiophene ring.

A photoelectric conversion element of this invention is suitably applied to a solar cell.

A dye-sensitized photoelectric conversion element with high photoelectric conversion efficiency and high durability and a solar cell having the photoelectric conversion element can be provided by the invention.

THE BEST EMBODIMENT FOR EMBODYING THE INVENTION

The invention is described in detail bellow. Majority of known organic dye showing the photoelectric conversion ability has only one acidic group which causes absorption with the titanium oxide thin layer. It is expected that the absorbing ability to the titanium oxide thin layer is raised and the transfer of the photo-excited electron to the titanium oxide thin layer can be carried out with high efficiency by making the number of the acidic group to be plural.

Furthermore, it has been known that a photoelectric conversion element having high conversion efficiency can be obtained by expanding the convertible wavelength range caused by expanding the absorption wavelength of dye by forming an aggregate of the due. The inventors find that the dyes having sufficient aggregate forming ability and high photoelectric conversion efficiency can be obtained by introducing a long-chained alkyl group into a triarylamine dye mother nucleus. It is considered that the acidic groups not adsorbed to the titanium oxide thin layer are left when the dye has plural acidic groups. In such the case, it is found that the aggregate tends to be formed by hydrogen bond forming ability between the acidic groups not used for the adsorption.

It is observed that the dye having the above characteristics easily forms the aggregate when adsorbing with the titanium oxide thin layer and the absorption spectrum is shifted to longer wavelength side compared to that of the single molecular absorption. Thus utilization of visible light of longer wavelength side for photoelectric conversion can be made possible and the sensitizing dyes are found, which are superior in the conversion efficiency to dyes having one acidic group or no alkyl chain.

The compounds represented by Formulas 1 or 2 are described below.

As the aryl or arylene group constituting the group represented by $Ar_1$, $Ar_2$, $Ar_3$, $Ar_{11}$, $Ar_{12}$, $Ar_{13}$, $Ar_{14}$ and $Ar_{15}$, a phenyl group, a naphthyl group, a biphenyl group, an anthryl group and a styryl group are cited for example, and as the heterocyclic group, a thienyl group, a furyl group, an indolyl group, a phenanthryl group, a rhodanine ring and a pyrazolone ring are cited. Concrete examples of the aryl group and the heterocyclic group are shown below. Besides, the hydrogen atom in $Ar_1$, $Ar_2$, $Ar_3$, $Ar_{11}$, $Ar_{12}$, $Ar_{13}$ and $Ar_{14}$ may be substituted by a mono-valent group selected from an alkyl group, an aralkyl group, an alkenyl group, an aryl group, an aromatic heterocyclic group, a halogen atom, a cyano group, a nitro group, an alkoxy group and a thioalkyl group. The group represented by $Ar_1$, $Ar_2$, $Ar_3$, $Ar_{11}$, $Ar_{12}$, $Ar_{13}$, $Ar_{14}$ and $Ar_{15}$ each are the aryl or heterocyclic group or their composite

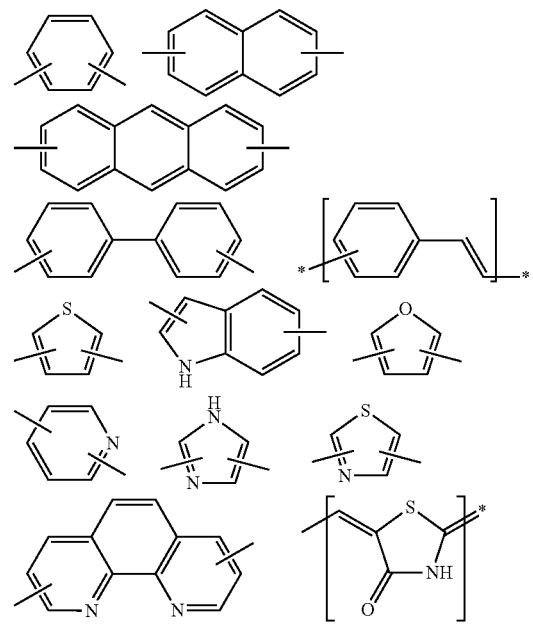

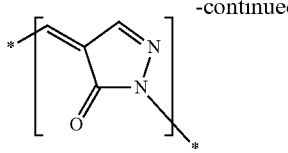
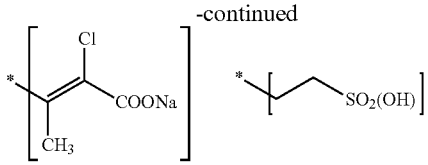

Concrete example of the acidic group being in the group represented by $X_1, X_2, X_{11}, X_{12}, X_{13}$ and $X_{14}$ in the compounds represented by Formulas 1 or 2 includes an oxo group such as a carboxyl group, a phosphoric acid group and a sulfonic acid group. The acidic group may be a free acid or a conjugated base thereof. When plural acidic groups exist, they may be the same or different. The groups represented by $X_1, X_2, X_{11}, X_{12}, X_{13}$ and $X_{14}$ are each preferably an electron attractive group. It is particularly preferable that the acidic groups in $Ar_n$ corresponding to $X_n$ are each bonded by π-conjugated system. In this instance n is an integer of 1, 2, 11, 12, 13, and 14. The inter molecular hydrogen bonding action is caused by the presence of two or more groups each having the acidic group in the compound represented by Formulas 1 or 2 and a preferable effect for aggregate formation is obtained. However, the number of the acidic group is preferably four or less because the solubility of the compound in organic solvent is lowered and the adsorption from the solution is difficultly carried out sometimes when five or more acidic groups exist.

The electron attractive substituent is preferably a substituent having a Hammett substituent constant of not less than 0.01 and more preferably not less than 0.1. The values described in Journal of Medical Chemistry, 1973, Vol. 16, No. 11, 1207-1216 are applicable as the Hammett substituent constants. Examples of the electron attractive group include a halogen atom such as a fluorine atom ($\sigma_p$: 0.06), a chlorine atom ($\sigma_p$: 0.23), a bromine atom ($\sigma_p$: 0.23) and an iodine atom ($\sigma_p$: 0.18), a trihalomethyl group such as a tribromomethyl group ($\sigma_p$: 0.29), a trichloromethyl group ($\sigma_p$: 0.33) and a trifluoromethyl group ($\sigma_p$: 0.54), a cyano group ($\sigma_p$: 0.66), a nitro group ($\sigma_p$: 0.78), a methanesulfonyl group ($\sigma_p$: 0.72), an acetyl group ($\sigma_p$: 0.50), a methoxycarbonyl group ($\sigma_p$: 0.45), a carbamoyl group ($\sigma_p$: 0.36) and a sulfamoyl group ($\sigma_p$: 0.57).

As the cyclic structure of the electron attractive group, a rhodanine ring, a pyran ring, a quinone ring a pyrimidine ring, a pyrazolone ring, squarylic acid and a tropolone ring are cited.

Concrete examples of the group represented by $X_1$, $X_2$, $X_{11}$, $X_{12}$, $X_{13}$ and $X_{14}$ having the acidic group are shown below.

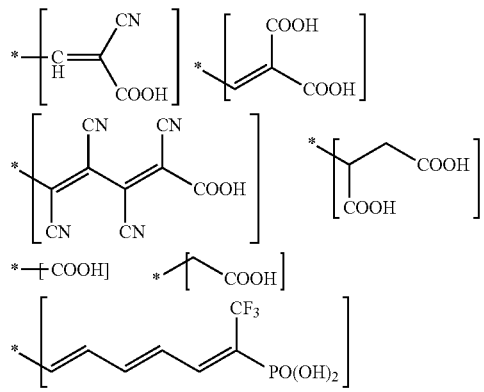

It is known that self aggregation force by van der Waals interaction acts between hydrocarbon groups. The aggregation force is strengthened accompanied with prolongation of the alkyl chain and remarkable aggregation force is caused when the number of the carbon atoms is 5 or more. However, the solubility of the compound in a polar solvent to be used for adsorbing the compound is lowered so that the adsorption from the solution is difficultly performed when the number of carbon atoms is 31 or more or the number of the aliphatic hydrocarbon groups is 9 or more. Therefore, the preferable range of the number of carbon atoms of the aliphatic hydrocarbon group is from 5 to 30 and the preferable range of the number of the aliphatic hydrocarbon groups in the compound represented by Formulas 1 or 2 is from 1 to 8. The self aggregation force is most strongly realized when the aliphatic hydrocarbon group is a straight chain saturated alkyl group and such the group is particularly preferred.

Concrete examples of the compound represented by Formulas 1 or 2 are shown below.

Dye 1

Dye 2
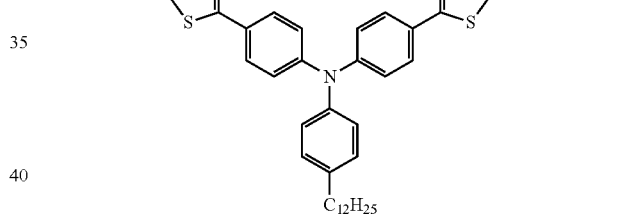

Dye 3
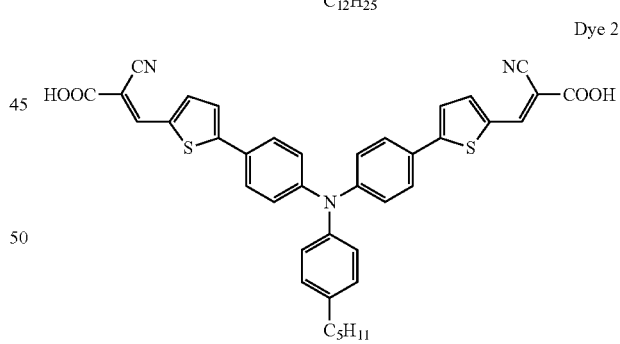

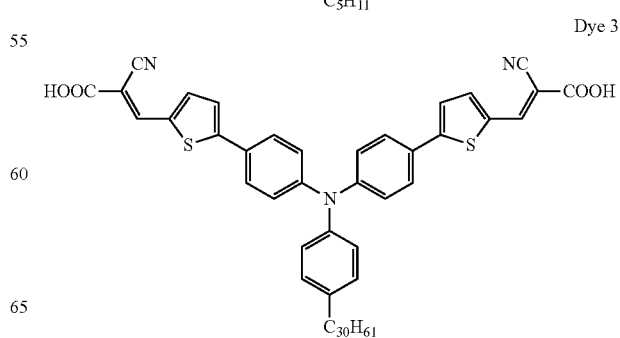

-continued
Dye 4
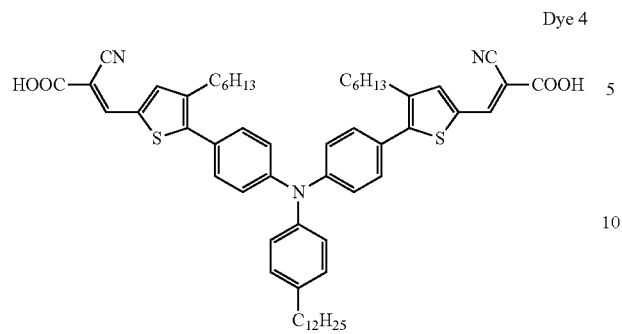
Dye 8
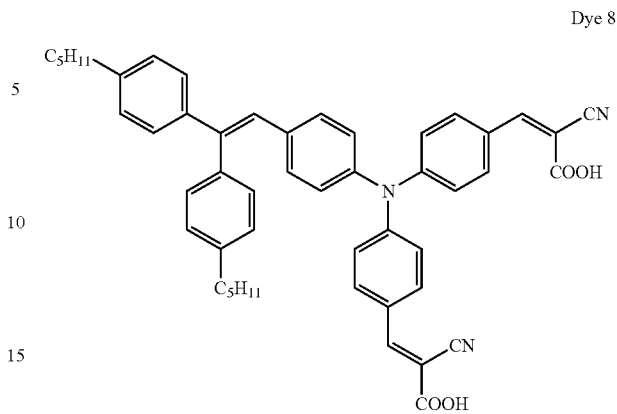
Dye 5
Dye 9
Dye 6
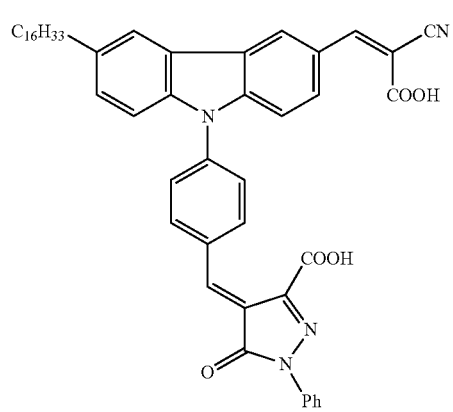
Dye 10
Dye 7
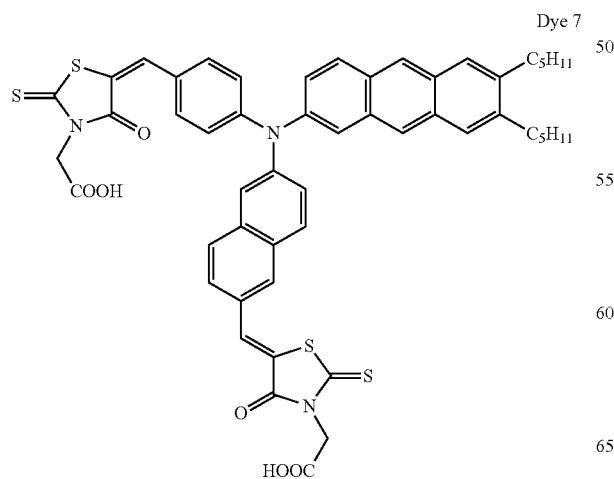
Dye 11
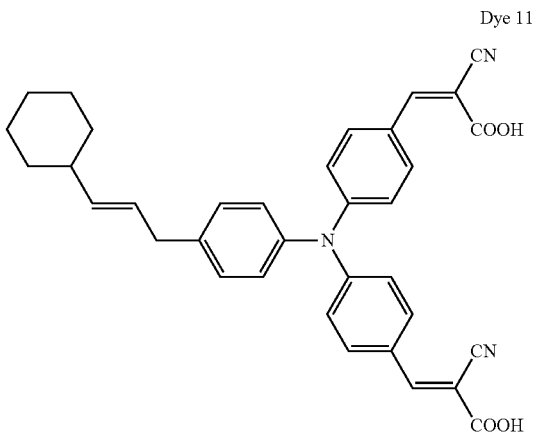

-continued

Dye 12

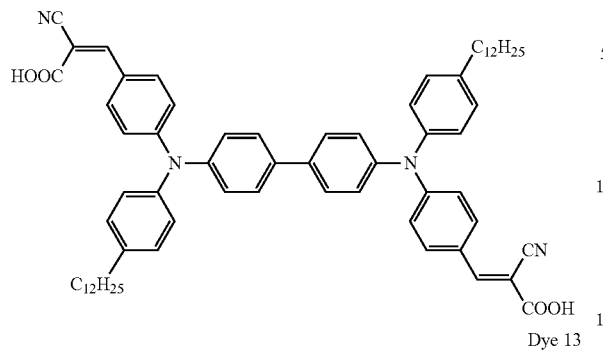

Dye 13

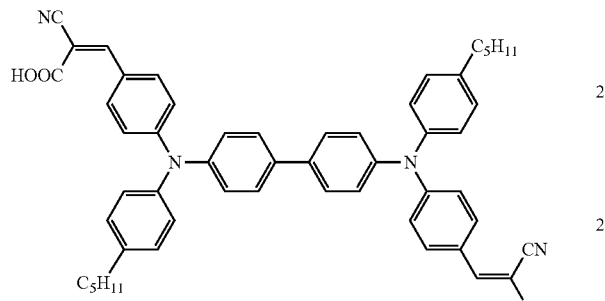

Dye 14

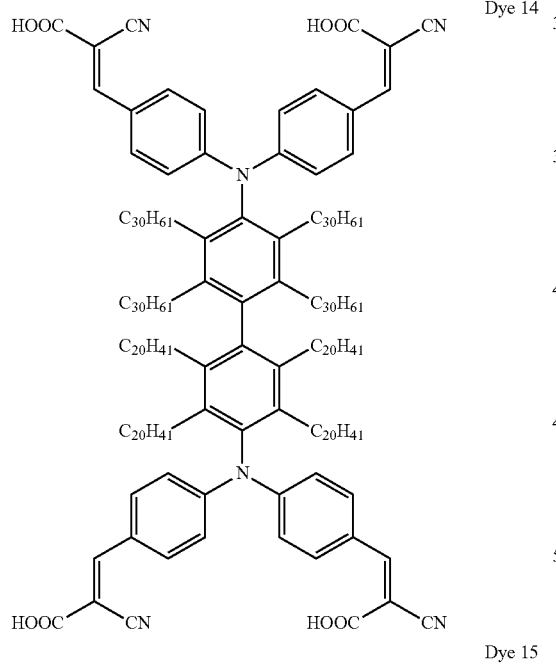

Dye 15

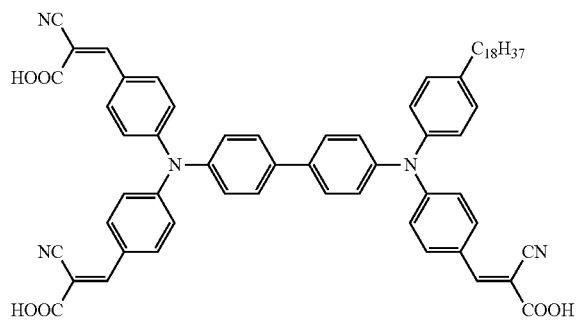

-continued

Dye 16

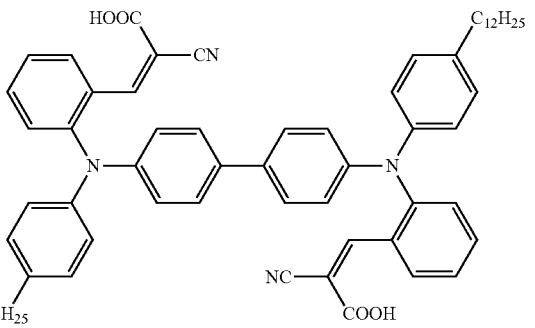

(Synthesizing Example)

A concrete synthesizing example of the compound represented by Formulas 1 or 2 is shown below and another compound can be synthesized in the similar manner.

Synthesis of Dye 1

One equivalent weight of diphenylamine, 1 equivalent weight of 1-bromo-4-dodecylbenzene, 0.1 equivalent weight of palladium(II) acetate, 0.4 equivalent weight of tri(t-butyl) phosphine and 4.8 equivalent weight of potassium t-butoxide were heated in a toluene solution at 90° C. for 2 hours to obtain 4-dodecyl-N,N-diphenylaniline. To the above resultant, 2 equivalent weight of N-bromosuccinimide was added and stirred for 30 minutes at room temperature in N,N-dimethylformamide to obtain 4-dodecyl-N,N-bis(4-bromophenyl)aniline. To the obtained compound, 3 equivalent weight of thiophene boric acid, 0.06 equivalent weight of tetrakis(triphenylphosphine)palladium and 2 equivalent weight of potassium carbonate were added, and heated and refluxed for 3 days in a mixture solvent of THF and water to obtain 4-dodecyl-N,N-bis(4-thiophene-2-yl)phenyl)aniline. To the obtained compound, 5 equivalent weight of phosphorus oxychloride and 5 equivalent weight of N,N-dimethylformamide were added and heated at 105° C. for 5 hours under nitrogen atmosphere for diformylizing the thiophene ring. An acetic acid solution composed of the above obtained diformilized compound, 4 equivalent weight of cyanoacetic acid and 5 equivalent weight of ammonium acetate was heated and refluxed for 1 hour. Thus Dye 1 could be obtained.

The chemical shift of Dye 1 was $^1$H-NMR (Acetone-$d_6$, δ) 0.86 (t, 3H, $CH_3$), 1.28 (br, 18H, $CH_2$), 1.63 (br, 2H, $CH_2$), 2.62 (t, 2H, $CH_2Ar$), 7.05-7.32 (br, 12H, ArH), 7.56 (d, 1H, ArH), 7.61 (d, 1H, ArH), 7.71 (d, 1H, ArH), 7.75 (d, 1H, ArH) 7.94 (t, 1H, CH=C(CN) Z) and 8.41 (s, 1H, CH=C(CN) E).

The other dyes were synthesized in the similar manner.

In the photoelectric conversion element, a compound containing an element included in Groups 2 to 5 and Groups 13 to 15 of the periodic table (also called as Element periodic table), a metal chalcogenide such as an oxide, sulfide and selenide) and a metal nitride are usable for the semiconductor layer.

Examples of preferable metal chalcogenide include an oxide of titanium, tin, zinc, iron, tungsten, zirconium, hafnium, strontium, indium, cerium, yttrium, lanthanum, vanadium, niobium and tantalum, a sulfide of cadmium, zinc, lead, silver, antimony and bismuth, a selenide of cadmium and lead, and a telluride of cadmium. As another compound of the semiconductor, a phosphide of zinc, gallium, indium and cadmium, a selenide of gallium-arsenic and copper-indium, a sulfide of copper-indium and a nitride of titanium are cited.

Concrete examples include $TiO_2$, $ZrO_2$, $SnO_2$, $Fe_2O_3$, $WO_3$, ZnO, $Nb_2O_5$, $Ta_2O_5$, CdS, ZnS, PbS, $Bi_2S_3$, CdSe, CdTe, GaP, Inp, GaAs, $CuInS_2$ and $Ti_3N_4$. $TiO_2$, ZnO, $SnO_2$, $Fe_2O_3$, $WO_3$, $Nb_2O_5$, CdS and PbS are preferably used and $TiO_2$ and $SnO_2$ are more preferably used. Among them $TiO_2$ is particularly preferable.

The plural kinds of the above semiconductors may be used in combination in the photo-electrode. For example, several kinds of the above metal oxide or metal sulfide may be used and titanium oxide semiconductor containing 20% by weight of titanium nitride ($Ti_3N_4$) may be use. The zinc oxide/tin oxide composite described in J. Chem. Soc., Chem. Commun., 15 (1999) may also be applied. When another component of semiconductor other than the metal oxide or metal sulfide is added, the ratio of such the additional component is preferably not more than 30% of the metal oxide or the metal sulfide. The total content of the compound represented by Formulas 1 or 2 per square meter of the semiconductor layer (or semiconductor) is preferably from 0.01 to 100 millimoles, more preferably from 0.1 to 50 millimoles, and particularly preferably from 0.5 to 20 millimoles.

When sensitization is carried out using the compound represented by Formulas 1 or 2, the compound represented by Formulas 1 or 2 may be used solely or in combination of plural kinds of the compound. It is also arrowed that the compound represented by Formulas 1 or 2 can be used by mixing with another dye such as those described in U.S. Pat. Nos. 4,684,537, 4,927,721, 5,084,365, 5,350,644, 5,463,057 and 5,525,440, and JP-A H07-249790 and JP-A 2000-150007.

Particularly, it is preferable to used a mixture of two or more kinds of dye each different in the absorbing light wavelength for extending the photoelectric convertible wavelength rage as wide as possible so as to effectively utilize solar light when the transducer is used for the later-mentioned solar cell. For adding the compound represented by Formulas 1 or 2 into the semiconductor layer, a method is generally applied in which the compound is dissolved in a suitable solvent such as ethanol and the sufficiently dried semiconductor is immersed in the solution.

When the plural kinds of the compound represented by Formulas 1 or 2 or a combination with another sensitizing dye are used, it is allowed that a solution of mixture of various dyes is prepared and used or that solutions of each of the compounds are separately prepared and the semiconductor layer is successively immersed therein. In the case of that the solutions of each of the compounds or another sensitizing dye are separately prepared and the semiconductor layer is successively immersed in these solutions, the effect of the invention can be obtained even when the immersion is carried out in any order. Moreover, the transducer can be prepared by using a mixture of the semiconductor particles on each of which the compounds or another dye are individually adsorbed.

The adsorbing treatment may be applied to the semiconductor in a particle state or a layer state formed on a substrate. The solution of the compound to be used for the adsorption treatment may be used at room temperature or in a heated state at a temperature within the range in which the compound is not decomposed and the solution is not boiled. The adsorption of the dye may be performed after coating of the fine particles of the semiconductor as later-mentioned. The adsorption of the compound may also be performed by simultaneously coating the fine particles of the semiconductor and the dye. The dye not adsorbed to the semiconductor can be removed by washing.

The sensitization of the semiconductor layer is carried out by adding the compound represented by Formulas 1 or 2, and the detail of the sensitization treatment is described in the later description relating to the photoelectric conversion element.

In the case of the semiconductor layer has a semiconductor thin layer having high porosity, it is preferred that the treatment by the dye or the sensitizing dye (sensitizing treatment for the semiconductor layer) is completed before the adsorption of water caused by water or vapor thereof in the pores of the surface and interior of the semiconductor thin layer.

The semiconductor layer may be treated by an organic base. As the organic base, diphenylamine, triphenylamine, pyridine, 4-t-butylpyridine, polyvinylpyridine, quinoline, piperidine and amidine are cited. Among them, pyridine, 4-t-butylpyridine and polyvinylpyridine are preferred.

When the above organic base is a liquid, the compound is used itself and when the amine compound is solid, a solution of it dissolved in an organic solvent is prepared, and the surface treatment can be performed by immersing the semiconductor layer into the above liquid amine or the amine solution.

As the dye usable in combination with the compound represented by Formulas 1 or 2, any dye can be used as long as the dye can spectrally sensitize the semiconductor layer. Two or more kinds of the dye are preferably mixed and used for expanding the photoelectric convertible wavelength range and raising the conversion efficiency. The dye to be combined and its ratio can be selected for fitting to the wavelength range and the intensity distribution of the objective light source.

Among the dyes for mixing used, a metal complex dye, a phthalocyanine dye, a porphyrin dye and a polymethine dye are preferably used from the comprehensive viewpoint such as photoelectron transfer reactivity, lightfastness and photochemical stability.

Photoelectric Conversion Element

The photoelectric conversion element is constituted by facing a semiconductor electrode composed of the semiconductor layer, on which the dye is adsorbed, formed on the substrate to a counter electrode through a charge transfer layer. The semiconductor electrode, charge transfer layer and counter electrode are described below.

(Semiconductor Electrode)

Preparation method of the semiconductor electrode relating to the invention is described below.

In an embodiment of the semiconductor electrode, the electrode is prepared by forming the semiconductor on an electroconductive substrate by burning.

When the semiconductor is prepared by burning, the sensitization treatment (adsorption and coming into pores) of the semiconductor is preferably performed after the burning It is particularly preferred that the dye adsorption is rapidly carried out after burning before adsorption of water.

When the semiconductor is in a particle state, the semiconductor electrode is preferably constructed by coating or spraying the particles onto the electroconductive substrate. When the semiconductor is in a membrane state which is not held by any substrate, the semiconductor electrode is preferably prepared by pasting the membrane on the electroconductive substrate.

(Electroconductive Substrate)

An electroconductive material such as a metal plate, and a non-electroconductive material such as a glass plate and plastic film on which an electroconductive material is provided are used for the electroconductive substrate of the photoelectric conversion element or the solar cell. Examples of the material to be used for the electroconductive substrate include a metal such as platinum, gold, silver, copper, aluminum, rhodium and indium, an electroconductive metal oxide such as indium-tin oxide composite and fluorine-doped tin oxide, and carbon. The thickness of the electroconductive is preferably from 0.3 to 5 mm although the thickness is not specifically limited.

It is preferable that the electroconductive substrate is substantially transparent. The term of "substantially transparent" means that the transmittance is not less than 10%, preferably not less than 50%, and most preferably not less than 80%. It is preferable for obtaining the transparent electroconductive substrate to provide an electroconductive layer composed of the electroconductive metal oxide on the surface of the glass plate or plastic film. When the transparent substrate is used, light is preferably applied from the substrate side.

The surface resistance of the electroconductive substrate is preferably not more than 50 $\Omega/cm^2$ and more preferably not more than 10 $\Omega/cm^2$.

(Preparation of Semiconductor Fine Particle-Containing Coating Composition)

First, a coating composition containing the semiconductor fine particles is prepared. The primary particle diameter of the semiconductor fine particles is preferably as fine as possible which is preferably from 1 to 5,000 nm and more preferably from 2 to 50 nm. The coating composition containing the semiconductor fine particles can be prepared by dispersing the semiconductor fine particles in a solvent. The semiconductor fine particle is in a state of primary particle. The solvent is not specifically limited as long as it can disperse the semiconductor fine particles.

As the solvent, waters an organic solvent, and a mixture of water and an organic solvent are usable. As the organic solvent, an alcohol such as methanol and ethanol, a ketone such as methyl ethyl ketone, acetone and acetylacetone, and a hydrocarbon such as hexane and cyclohexane are used. A surfactant and a viscosity controlling agent such as a polyalcohol, for example, polyethylene glycol can be added according to necessity. The concentration of the semiconductor fine particles in the solvent is preferably from 0.1 to 70%, more preferably from 0.1 to 30%, by weight.

(Coating of Semiconductor Fine Particle-Containing Liquid and Burning Treatment of Formed Semiconductor Layer)

The above obtained semiconductor fine particle-containing coating composition is coated or sprayed onto the electroconductive substrate and dried and then burned in air or inactive gas to form a semiconductor layer (semiconductor coat).

The layer formed by coating and drying the coating composition onto the electroconductive substrate is composed of aggregate of the semiconductor fine particles and the diameter of the fine particle corresponds to the primary particle diameter of the used semiconductor fine particle.

In thus formed layer of the semiconductor fine particle aggregate on the substrate such as the electroconductive substrate, the bonding force between the electroconductive substrate and that between the fine particles are weak and the mechanical strength of the layer is also weak. Therefore, the burning treatment of the semiconductor fine particle aggregate layer is preferably carried out because the mechanical strength is raised and the layer strongly fixed on the substrate can be formed by the burning treatment. The burned layer may have any structure and a porous structured layer is preferable.

The porosity of the semiconductor layer is preferably not more than 10%, more preferably not more than 8%, and particularly preferably From 0.01 to 5%, by volume. The porosity of the semiconductor layer is a porosity of pores piercing in the thickness direction of the layer, and can be measured by an apparatus available on the market such as a mercury porosimeter Shimadzu Porelyzer 9220.

The thickness of the burned semiconductor layer having the porous structure is preferably not less than 10 nm and more preferably from 100 to 10,000 nm.

The burning temperature is preferably not more than 1,000° C., more preferably from 200 to 800° C., and particularly preferably from 300 to 800° C. for suitably controlling the effective surface area of the burned layer and obtaining the burned layer having the above porosity on the occasion of the burning treatment.

The ratio of the effective surface area to the appearance surface area can be controlled by the diameter and specific surface area of the semiconductor fine particles and the burning temperature. After the heating treatment, the semiconductor layer may be subjected to chemical plating using an aqueous solution of titanium tetrachloride or electric plating using an aqueous solution of titanium trichloride for increasing the surface area of the semiconductor particle and raising the purity near the semiconductor particle so as to raise the electron injection efficiency from the dye to the semiconductor particle.

(Sensitizing Treatment of Semiconductor)

The sensitizing treatment of the semiconductor is carried out by immersing the burned substrate into a solution prepared by dissolving the dye in a suitable solvent. On such the occasion, it is preferable that the bubble in the semiconductor layer is eliminated by treating in the reduced pressure or heating the substrate on, which the semiconductor layer is formed by burning so that the compound represented by Formulas 1 or 2 is easily penetrated into deep interior of the semiconductor layer (semiconductor coat), and such the treatment is particularly preferred when the semiconductor layer (semiconductor coat) has the porous structure.

The solvent for dissolving the compound represented by Formulas 1 or 2 is not specifically limited as long as the solvent can dissolve the dye and does not dissolve or react with the semiconductor, and the solvent is preferably subjected to deaeration and purification by distillation to prevent penetration of moisture and gas dissolved in the solvent into the semiconductor layer so as to disturb the sensitizing treatment such as dye adsorption.

The solvents preferably used for dissolving the dye are an alcohol type solvent such as methanol, ethanol, n-propanol and t-butyl alcohol, a ketone type solvent such as acetone and methyl ethyl ketone, an ether type solvent such as diethyl ether, di-isopropyl ether, tetrahydrofuran and 1,4-dioxane, a nitrile type solvent such as acetonitrile and propionitrile, and a halogenized hydrocarbon type solvent such as methylene chloride and 1,1,2-trichloroethane. A mixture of them may be used, and particularly preferred solvents are ethanol, t-butyl alcohol and acetonitrile.

(Temperature and Time for Sensitizing Treatment)

The time for immersing the substrate on which the semiconductor layer is formed by burning in the solution containing the compound represented by Formulas 1 or 2 is preferably from 1 to 48 hours, and more preferably from 3 to 24 hours, at 25° C. for sufficiently making progress the adsorption by deeply penetrating into the semiconductor layer to sufficiently sensitizing the semiconductor, and for inhibiting obstruction by decomposed products formed by decomposition of the dye in the solvent. Such the effect is remarkable when the semiconductor layer has porous structure. The above immersion time is that at 25° C. and is not always applied when the temperature is varied.

On the occasion of the immersion, the solution containing the compound represented by Formulas 1 or 2 may be heated for use within the range in which the dye is not decomposed and the solution is not boiled. Preferable temperature range is from 10 to 100° C. and more preferably from 25 to 80° C. as long as the solution is not boiled.

(Charge Transfer Layer)

The charge transfer layer to be used in the invention is described below.

A redox electrolyte is preferably used in the charge transfer layer. As the redox electrolyte, $I^-/I_3^-$ system, $Br^-/Br_3^-$ system and quinone/hydroquinone system are cited. Such the electrolyte can be obtained by a known method, for example, the electrolyte of $I^-/I_3^-$ system can be obtained by mixing an ammonium salt of iodine and iodine. The charge transfer layer is constituted by a dispersion of such the redox electrolyte, and the dispersion is called as a liquid electrolyte when the dispersion is a solution and called as a solid polymer electrolyte when the electrolyte is dispersed in a polymer which is solid at room temperature, and called as a gel electrolyte when the electrolyte is dispersed in a material in a gel state. When the liquid electrolyte is used in the charge transfer layer, an electrochemically inactive substance is used as the solvent such as acetonitrile, propylene carbonate and ethylene carbonate. As examples of solid polymer electrolyte, electrolytes described in JP-A2001-160427 and as examples of the gel electrolyte, those described in "Hyomen Kagaku (Surface Science)" 21, 5, 288-293 are cited.

(Counter Electrode)

The counter electrode to be used in the invention is described below.

Any electroconductive materials can be optionally used for the counter electrode and one having catalytic ability for performing the reducing reaction of the redox ion of $I_3^-$ or another ion in sufficient rate is preferably used. As such the electrode, a platinum electrode, an electrode of an electroconductive material plated with platinum on the surface thereof, that of rhodium metal, ruthenium metal, ruthenium oxide or carbon are cited.

(Solar Cell)

The solar cell is described below.

The solar cell is an embodiment of the photoelectric conversion element which is designed for optimizing to solar light so as to have a structure capable for performing optimum photoelectric conversion when solar light is used as the light source. Namely, the solar cell is structured so that the semiconductor sensitized by the dye is irradiated by solar light. It is preferable for constituting the solar cell that the semiconductor electrode, charge transfer layer and counter electrode are housed in a case and sealed or they are entirely sealed by resin.

When electromagnetic radiation of solar light or that equal with solar light is irradiated to the solar cell, the dye absorbs the electromagnetic radiation and is exited. An electron generated by the excitement is transferred to the semiconductor and then transferred to the counter electrode through the electroconductive substrate and reduces the redox electrolyte of the charge transfer layer. Besides, the dye in a oxidized state after releasing the electron is reduced by the electron supplied from the counter electrode through the redox electrolyte of the charge transfer layer and returned in the original state, and the redox electrolyte of the charge transfer layer is simultaneously oxidized so as to be returned into the state capable of being reduced by the electron supplied from the counter electrode. Thus electron is flows and the solar cell using the photoelectric conversion element can be constituted.

EXAMPLES

The invention is described referring examples.

Example 1

Preparation of Photoelectric Conversion Element 1

Titanium oxide paste having a particle size of 18 nm was coated by a screen printing method on a glass substrate given electroconductivity by fluorine-doped tin oxide (FTO). The paste was dried by heating at 60° C. for 10 minutes and burned at 500° C. for 30 minutes to obtain a titanium oxide thin layer having a thickness of 5 μm.

Dye 1 was dissolved in ethanol to prepare a solution having a concentration of $3 \times 10^{-4}$ moles/l. The FTO glass substrate on which the titanium oxide paste was coated and burned was immersed in the above solution for 16 hours at room temperature for performing dye adsorption to prepare a semiconductor electrode.

As the charge transfer layer (electrolysis solution), a. 3-methoxypropionitrile solution containing 0.6 g/l of 1,2-dimethyl-3-propylimidazolium iodide, 0.1 moles/l of lithium iodide, 0.05 moles/l of iodine and 0.5 moles/l of 4-(t-butyl) pyridine was used. A platinum plate was used for the counter electrode. The counter electrode is assembled by a clump cell together with the above prepared semiconductor electrode and the electrolysis solution to prepare Photoelectric conversion element 1.

Preparation of Photoelectric Conversion Elements 2 to 17

Photoelectric conversion elements 2 to 17 were prepared in the same manner as in Photoelectric conversion element 1 except that the Dyes 2 to 16 or Comparative Dye 1 was used in place of Dye 1.

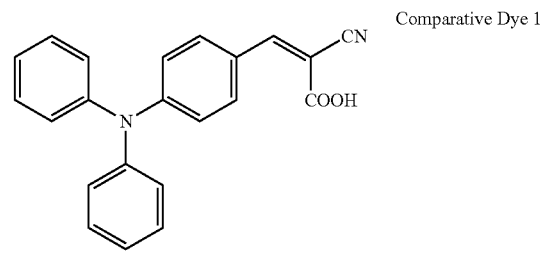

Comparative Dye 1

The semiconductor electrode was masked by a mask having a size of 5 mm square and irradiated by light of 100 mW/cm² of a xenon lamp for measuring the photoelectric conversion property.

The current voltage property of each of the Photoelectric conversion elements 1 to 17 was measured by an I-V tester and short circuit current (Jsc), open circuit voltage (Voc) and fill factor (FF) were determined, and photoelectric conversion efficiency (η (%)) was calculated from them. The photoelectric conversion efficiency of the photoelectric conversion element was calculated according to the following expression.

$$\eta = 100 \times (Voc \times Jsc \times FF)/P$$

In the above, P is intensity of incident light (mW·cm⁻²), Voc is the open circuit voltage (V) and Jsc is the short circuit current density (mA·cm⁻²) and FF is the fill factor.

The photoelectric conversion efficiency of each the photoelectric conversion elements using the Dye 1 to 16 and the comparative dye are listed in Table 1. After the measurement, the cells were each decomposed and washed and the semiconductor electrode was irradiated for 30 minutes by light of 100 mW/cm² of the xenon lamp for examining the lightfastness thereof. Clamp cells were rebuilt using the irradiated semiconductor electrodes, respectively, by assembling with the platinum electrode and the photoelectric conversion property of them was re-measured. The ratios of conversion efficiency after light irradiation to that of before light irradiation are listed in Table 1.

TABLE 1

| Photoelectric conversion element | Dye | Conversion efficiency (%) | Conversion efficiency ratio of after aging test | Remarks |
|---|---|---|---|---|
| 1 | Dye 1 | 4.6 | 0.49 | Inventive |
| 2 | Dye 2 | 4.2 | 0.45 | Inventive |
| 3 | Dye 3 | 4.3 | 0.46 | Inventive |
| 4 | Dye 4 | 4.0 | 0.51 | Inventive |
| 5 | Dye 5 | 3.8 | 0.51 | Inventive |
| 6 | Dye 6 | 2.1 | 0.47 | Inventive |
| 7 | Dye 7 | 2.7 | 0.43 | Inventive |
| 8 | Dye 8 | 3.7 | 0.55 | Inventive |
| 9 | Dye 9 | 2.5 | 0.51 | Inventive |
| 10 | Dye 10 | 3.8 | 0.44 | Inventive |
| 11 | Dye 11 | 4.3 | 0.41 | Inventive |
| 12 | Dye 12 | 4.0 | 0.58 | Inventive |
| 13 | Dye 13 | 3.9 | 0.54 | Inventive |
| 14 | Dye 14 | 3.8 | 0.62 | Inventive |
| 15 | Dye 15 | 3.4 | 0.55 | Inventive |
| 16 | Dye 16 | 3.2 | 0.58 | Inventive |
| 17 | Comparative Example Dye 1 | 0.7 | 0.15 | Comparative |

Table 1 shows that the Dyes 1 to 16 each having the long chain alkyl group and two adsorption groups are superior in the photoelectric conversion property and the light fastness to Comparative Example 1 having one adsorption group and no long chain alkyl group.

It is understood from the above results that the introduction of the long chain alkyl group and plural adsorption groups to the compound represented by Formulas 1 or 2 is effectual for improving the photoelectric conversion efficiency.

The invention claimed is:

1. A photoelectric conversion element comprising a pair of electrodes, and a semiconductor layer comprising a semiconductor carrying a dye and an electrolyte layer between the electrodes, wherein the dye is represented by Formulas 1 or 2;

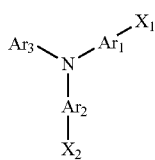

Formula 1 in Formula 1, $Ar_1$ and $Ar_2$ are each an arylene or heterocyclic group, or a composite group of an arylene group and a heterocyclic group, each of which may have a substituent, $Ar_3$ is an aryl or heterocyclic group or a composite group of an arylene group and a heterocyclic group, each of which may have a substituent, $Ar_1$, $Ar_2$ and $Ar_3$ may form a ring by bonding with each other, $X_1$ and $X_2$ are each a straight chain residue having an acidic group and the straight chain residue may have a mono-valent substituent, and one to eight saturated or unsaturated aliphatic hydrocarbon group each having 5 to 30 carbon atoms are bonded to $Ar_1$, $Ar_2$ and $Ar_3$;

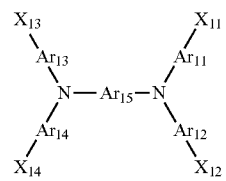

Formula 2 in Formula 2, $Ar_{11}$, $Ar_{12}$, $Ar_{13}$, $Ar_{14}$ and $Ar_{15}$ are each an arylene or heterocyclic group, or a composite group of an arylene group and a heterocyclic group, each of which may have a substituent, $Ar_{11}$, $Ar_{12}$, $Ar_{13}$, $Ar_{14}$ and $Ar_{15}$ may form a ring by bonding with each other, at least two of $X_{11}$, $X_{12}$, $X_{13}$ and $X_{14}$ are each an alkyl or alkenyl group having an acidic group and the alkyl or alkenyl group may have a monovalent substituent and the remainders are each a hydrogen atom, and one to eight saturated or unsaturated aliphatic hydrocarbon group each having 5 to 30 carbon atoms bonded to $Ar_{11}$, $Ar_{12}$, $Ar_{13}$, $Ar_{14}$ and $Ar_{15}$.

2. The photoelectric conversion element of claim 1, wherein the aliphatic hydrocarbon group in Formulas 1 or 2 is a straight-chain alkyl group.

3. The photoelectric conversion element of claim 1, wherein two of $X_{11}$, $X_{12}$, $X_{13}$ and $X_{14}$ in Formula 2 are each a straight-chain residue having an acidic group and the straight-chain residue may have a mono-valent substituent.

4. The photoelectric conversion element of claim 1, wherein the acidic group of the dye represented by Formulas 1 or 2 is a carboxyl group.

5. The photoelectric conversion element of claim 1, wherein $X_1$ and $X_2$ of the Formula 1 each have a cyano group.

6. The photoelectric conversion element of claim 1, wherein the groups each having acidic group among the groups represented by $X_{11}$, $X_{12}$, $X_{13}$ and $X_{14}$ of the Formula 2 each have a cyano group.

7. The photoelectric conversion element of claim 1, wherein the acidic group in one of $X_1$, $X_2$, $X_{11}$, $X_{12}$, $X_{13}$ and $X_{14}$ and one of $Ar_1$, $Ar_2$, $Ar_3$, $Ar_{11}$, $Ar_{12}$, $Ar_{13}$ and $Ar_{14}$ are each bonded by a π-conjugation system in each of Formula 1 and Formula 2.

8. The photoelectric conversion element of claim 1, wherein $Ar_1$, $Ar_2$ and $Ar_3$ of Formula 1 are each a benzene ring, a thiophene ring or a composite thereof.

9. The photoelectric conversion element of claim 1, wherein $Ar_{11}$, $Ar_{12}$, $Ar_{13}$, $Ar_{14}$ and $Ar_{15}$ of the Formula 2 are each a benzene ring, a thiophene ring or a condensed ring thereof.

10. The photoelectric conversion element of claim 1, wherein $Ar_1$ and $Ar_2$ in Formula 1 are each a benzene ring and the corresponding $X_1$ and $X_2$ are each bonded to the 4-position of each benzene ring.

11. The photoelectric conversion element of claim 1, wherein $Ar_{11}$, $Ar_{12}$, $Ar_{13}$ and $Ar_{14}$ in Formula 2 are each a benzene ring and the corresponding $X_{11}$, $X_{12}$, $X_{13}$ and $X_{14}$ are each bonded to the 4-position of the benzene ring.

12. The photoelectric conversion element of claim 1, wherein $Ar_1$ and $Ar_2$ have a group represented by Formula 3 and the corresponding $X_1$ and $X_2$ are each bonded to the 5-position of the thiophene ring Formula 3

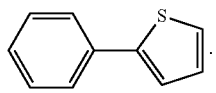

13. The photoelectric conversion element of claim 1, wherein $Ar_{11}$, $Ar_{12}$, $Ar_{13}$ and $Ar_{14}$ and $Ar_4$ have the group represented by Formula 3 and the corresponding $X_{11}$, $X_{12}$, $X_{13}$ and $X_{14}$ are each bonded to the 5-position of the thiophene ring.

14. The photoelectric conversion element of claim 1, wherein the semiconductor is titanium oxide.

15. A solar cell having the photoelectric conversion element of claim 1.

16. A photoelectric conversion element comprising a pair of electrodes, and a semiconductor layer comprising a semiconductor carrying a dye and an electrolyte layer between the electrodes, wherein the dye is represented by Formulas 1 or 2;

Formula 1

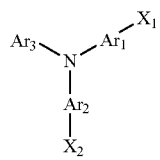

in Formula 1, $Ar_1$ and $Ar_2$ are each an arylene or heterocyclic group, or a composite group of an arylene group and a heterocyclic group, each of which may have a substituent, $Ar_3$ is an aryl or heterocyclic group or a composite group of an arylene group and a heterocyclic group, each of which may have a substituent, $Ar_1$, $Ar_2$ and $Ar_3$ may form a ring by bonding with each other, $X_1$ and $X_2$ are each a straight chain residue having an acidic group and the straight chain residue may have a mono-valent substituent, and one to eight saturated or unsaturated aliphatic hydrocarbon group each having 5 to 30 carbon atoms are directly bonded to $Ar_1$, $Ar_2$ and $Ar_3$;

Formula 2

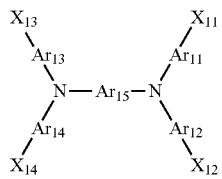

in Formula 2, $Ar_{11}$, $Ar_{12}$, $Ar_{13}$, $Ar_{14}$ and $Ar_{15}$ are each an arylene or heterocyclic group, or a composite group of an arylene group and a heterocyclic group, each of which may have a substituent, $Ar_{11}$, $Ar_{12}$, $Ar_{13}$, $Ar_{14}$ and $AR_{15}$ may form a ring by bonding with each other, at least two of $X_{11}$, $X_{12}$, $X_{13}$ and $X_{14}$ are each an alkyl or alkenyl group having an acidic group and the alkyl or alkenyl group may have a monovalent substituent and the remainders are each a hydrogen atom, and one to eight saturated or unsaturated aliphatic hydrocarbon group each having 5 to 30 carbon atoms are directly bonded to $Ar_{11}$, $Ar_{12}$, $Ar_{13}$, $Ar_{14}$ and $Ar_{15}$.

17. The photoelectric conversion element of claim 1, wherein $X_1$, $X_2$, $X_{11}$, $X_{12}$, $X_{13}$ and $X_{14}$ are represented by formulas of,

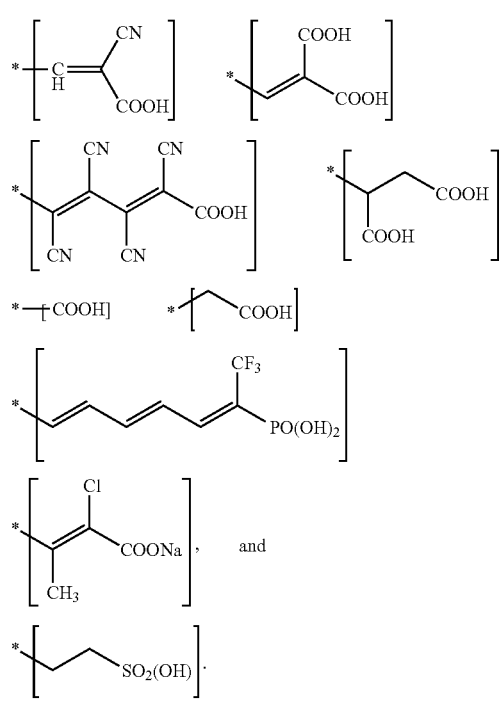

18. The photoelectric conversion element of claim 1, wherein the dye is represented by formulas of,

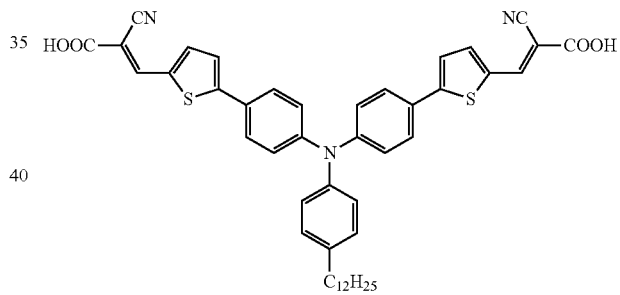

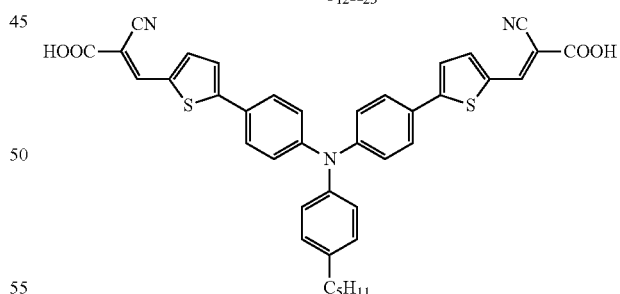

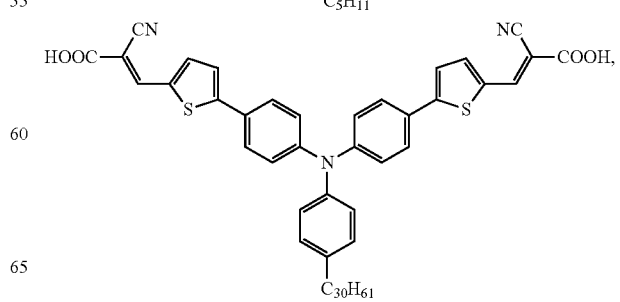

21
-continued
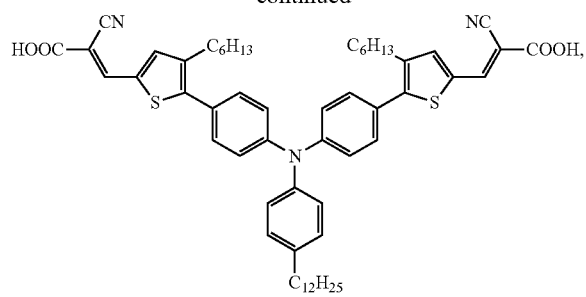
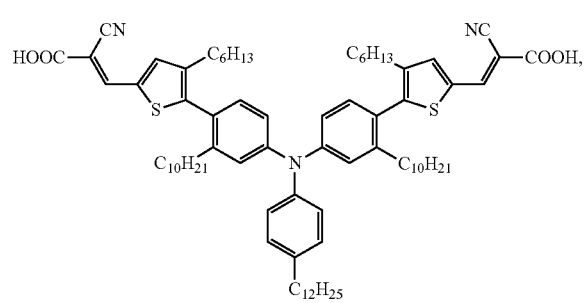
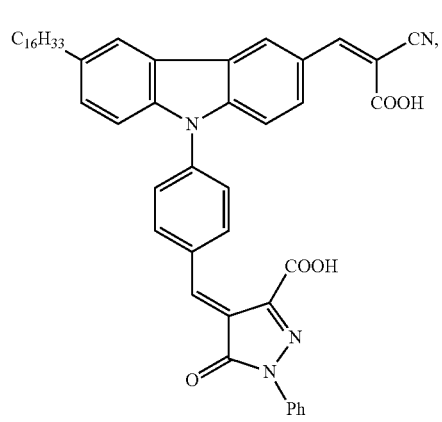
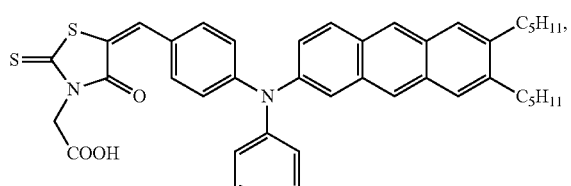
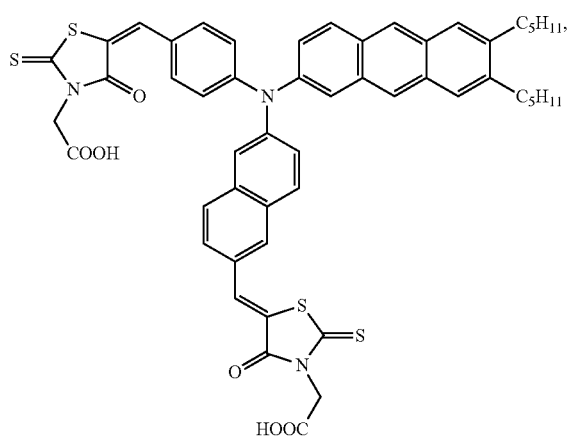
22
-continued
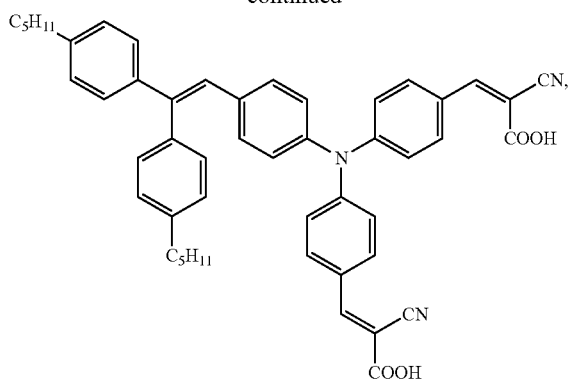
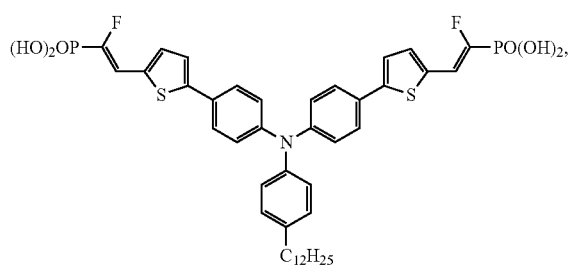
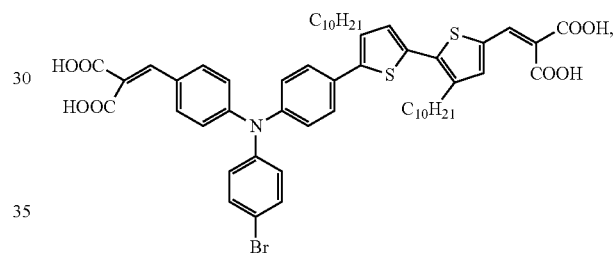
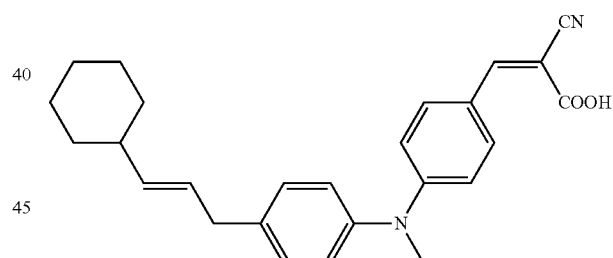
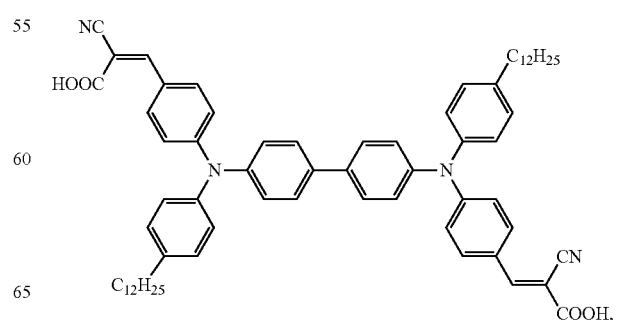

23
-continued
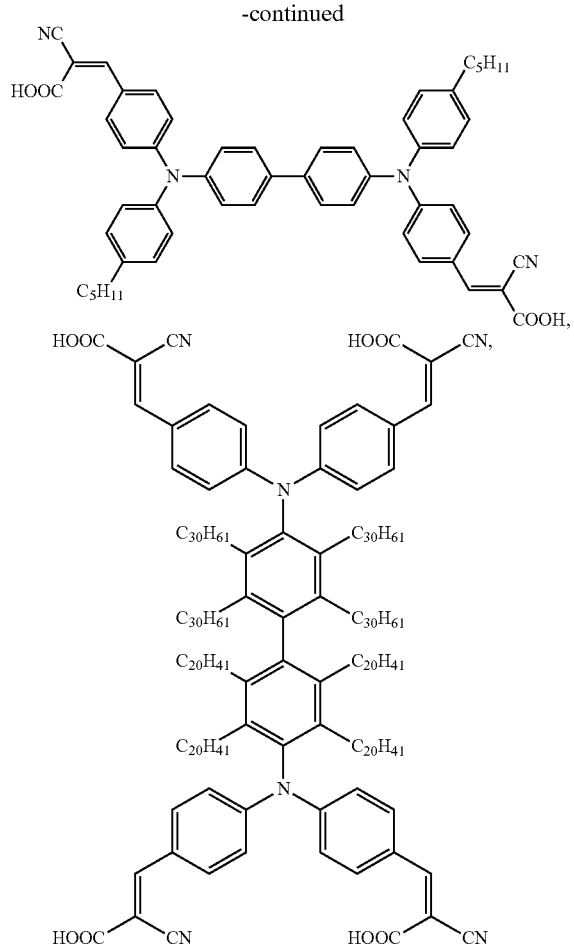
24
-continued
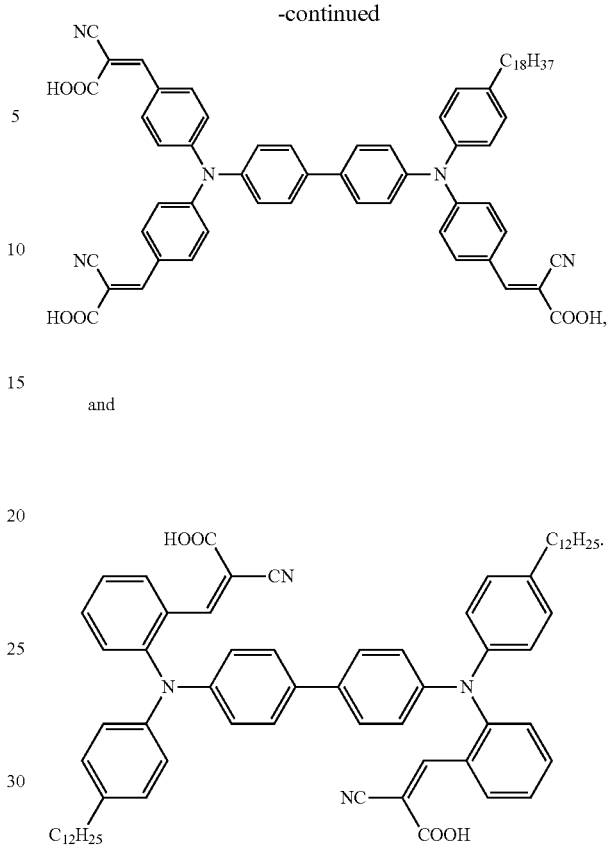
and
* * * * *